United States Patent
Kim

(10) Patent No.: US 10,121,524 B1
(45) Date of Patent: Nov. 6, 2018

(54) SEMICONDUCTOR DEVICES

(71) Applicant: SK hynix Inc., Icheon-si Gyeonggi-do (KR)

(72) Inventor: Chang Hyun Kim, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/828,974

(22) Filed: Dec. 1, 2017

(30) Foreign Application Priority Data

Jul. 19, 2017 (KR) .................. 10-2017-0091396

(51) Int. Cl.
  *G11C 7/22* (2006.01)
  *G11C 7/10* (2006.01)

(52) U.S. Cl.
  CPC ............ *G11C 7/222* (2013.01); *G11C 7/1084* (2013.01)

(58) Field of Classification Search
  CPC .................................. G11C 7/22; G11C 7/222
  See application file for complete search history.

(56) References Cited

U.S. PATENT DOCUMENTS

| | | | |
|---|---|---|---|
| 6,717,887 B1 * | 4/2004 | Kono ................. | G11C 7/22 327/141 |
| 2008/0031055 A1 * | 2/2008 | Lee .................... | G11C 7/222 365/189.05 |
| 2014/0254295 A1 * | 9/2014 | Shim .................. | G11C 7/1072 365/194 |
| 2016/0164533 A1 | 6/2016 | Zhai et al. | |

FOREIGN PATENT DOCUMENTS

KR  1020140007040 A  1/2014

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor device includes a command input circuit and an internal command generation circuit. The command input circuit is synchronized with a clock signal to generate an input command which is enabled if an external command is inputted to the command input circuit. The internal command generation circuit delays the input command by a predetermined period according to a latency information signal to generate an internal command, in synchronization with a first division clock signal and a second division clock signal generated by division of a frequency of the clock signal. The predetermined period is set to be equal to a sum of a first delay amount corresponding to "N" times a cycle time of the second division clock signal and a second delay amount corresponding to "M" times a cycle time of the clock signal.

25 Claims, 17 Drawing Sheets

FIG. 10

| CLK_2N | CLK_4N | PH<2> | PH<1> | COMPLEMENTARY SIGNAL |
|--------|--------|-------|-------|----------------------|
| 0      | 0      | 0     | 0     | 000(0)               |
| 1      | 1      | 0     | 1     | 111(-1)              |
| 0      | 1      | 1     | 0     | 110(-2)              |
| 1      | 0      | 1     | 1     | 101(-3)              |

FIG. 12

| RED<3> | RED<2> | RED<1> | EN<1:7> | SECOND DELAY AMOUNT |
|---|---|---|---|---|
| 1 | 0 | 1 | EN<1> | −3 |
| 1 | 1 | 0 | EN<1:2> | −2 |
| 1 | 1 | 1 | EN<1:3> | −1 |
| 0 | 0 | 0 | EN<1:4> | 0 |
| 0 | 0 | 1 | EN<1:5> | 1 |
| 0 | 1 | 0 | EN<1:6> | 2 |
| 0 | 1 | 1 | EN<1:7> | 3 |

SEMICONDUCTOR DEVICES

CROSS-REFERENCE TO RELATED APPLICATIONS

The present application claims priority under 35 U.S.C 119(a) to Korean Application No. 10-2017-0091396, filed on Jul. 19, 2017, which is herein incorporated by reference in its entirety.

BACKGROUND

1. Technical Field

Embodiments of the present disclosure relate to semiconductor devices delaying external commands by a latency period.

2. Related Art

Semiconductor devices may receive commands and data from an external device or may output data stored therein in response to the commands. For example, if a controller applies a command for a read operation to a semiconductor device such as a dynamic random access memory (DRAM) device, the semiconductor device may output data stored therein to the controller in response to a read command. In such a case, the data stored in the semiconductor device cannot be immediately outputted when the read command is inputted to the semiconductor device. This may be due to a resistance-capacitance (RC) delay time of signal transmission lines disposed in the semiconductor device and some internal operations such as an alignment operation of data.

In order that the semiconductor devices are successfully used without any errors, it may be necessary to set some parameters relating to timing of the commands and data which is used to perform internal operations of the semiconductor device. For example, it may be necessary to set a latency time corresponding to a time period from a time that the command is inputted to the semiconductor device until a time that data is actually stored in memory cells of the semiconductor device in response to the command (or until a time that data stored in the memory cells of the semiconductor device is actually outputted from the semiconductor device through output pads). A latency time corresponding to a time period from a time that the read command is inputted to the semiconductor device until a time that data stored in the semiconductor device is actually outputted from the semiconductor device in response to the read command may be referred to as a column address strobe (CAS) latency CL.

SUMMARY

According to an embodiment, a semiconductor device includes a command input circuit and an internal command generation circuit. The command input circuit is synchronized with a clock signal to generate an input command which is enabled if an external command is inputted to the command input circuit. The internal command generation circuit delays the input command by a predetermined period according to a latency information signal to generate an internal command, in synchronization with a first division clock signal and a second division clock signal generated by division of a frequency of the clock signal. The predetermined period is set to be equal to a sum of a first delay amount corresponding to "N" times a cycle time of the second division clock signal and a second delay amount corresponding to "M" times a cycle time of the clock signal.

According to another embodiment, a semiconductor device includes a selection command generation circuit and a selection/transmission circuit. The selection command generation circuit delays an input command generated from an external command by a predetermined period according to a latency information signal to generate a plurality of selection commands, in synchronization with a first division clock signal and a second division clock signal generated by division of a frequency of a clock signal. The selection/transmission circuit detects a time that the external command is inputted and outputs any one of the plurality of selection commands as an internal command according to the detection result. The predetermined period is set to be equal to a sum of a first delay amount corresponding to "N" times a cycle time of the second division clock signal and a second delay amount corresponding to "M" times a cycle time of the clock signal.

BRIEF DESCRIPTION OF THE DRAWINGS

Various embodiments of the present disclosure will become more apparent in view of the attached drawings and accompanying detailed description, in which:

FIG. 10 is a table illustrating an operation of the phase signal generation circuit included in the selection/transmission circuit of FIG. 8;

FIG. 12 is a table illustrating an operation of the comparison circuit shown in FIG. 11;

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
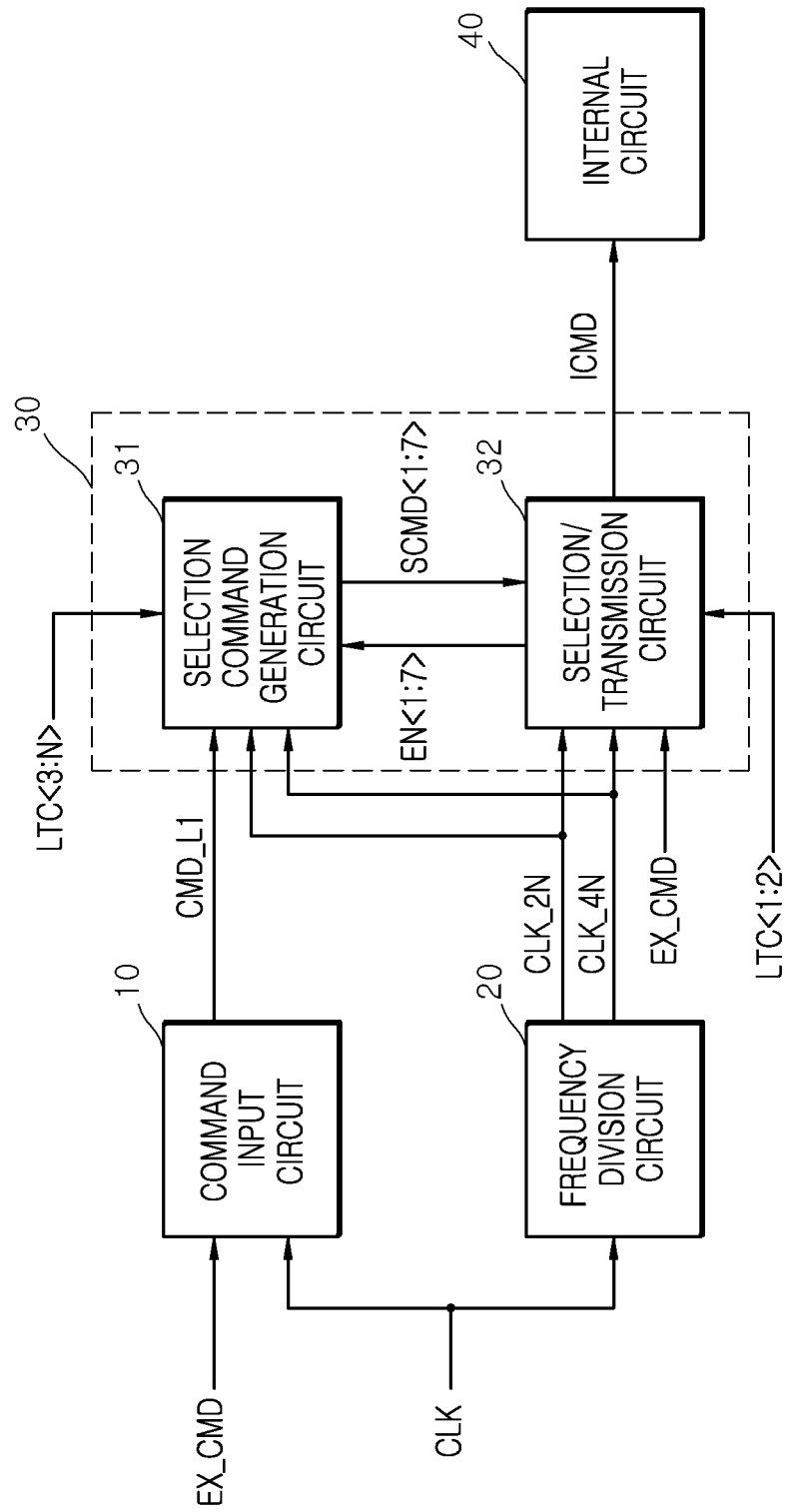
FIG. 1 is a block diagram illustrating a configuration of a semiconductor device according to an embodiment of the present disclosure.

As illustrated in FIG. 1, a semiconductor device according an embodiment may include a command input circuit 10, a frequency division circuit 20, an internal command generation circuit 30, and an internal circuit 40.

The command input circuit 10 may generate an input command CMD_L1 which is enabled if an external command EX_CMD is inputted to the command input circuit 10 in synchronization with a clock signal CLK. The command input circuit 10 may generate the input command CMD_L1 which is enabled during a predetermined period if the external command EX_CMD is inputted to the command input circuit 10 in synchronization with the clock signal CLK. Although the external command EX_CMD is illustrated with a single signal line, the external command EX_CMD may be set to include a plurality of bits and may be transmitted through lines that transmit at least one a group of addresses, commands, and data. The external command EX_CMD may be provided by a controller controlling the semiconductor device or a test apparatus for testing characteristics (e.g., some electrical parameters) of the semiconductor device.

The frequency division circuit 20 may divide a frequency of the clock signal CLK to generate a first division clock signal CLK_2N and a second division clock signal CLK_4N. The frequency division circuit 20 may divide a frequency of the clock signal CLK to generate the first division clock signal CLK_2N having a frequency which is half a frequency of the clock signal CLK. In other words, the first division clock signal CLK_2N may have a frequency which is one $(2N)^{th}$ a frequency of the clock signal CLK. The frequency division circuit 20 may divide a frequency of the clock signal CLK to generate the second division clock signal CLK_4N having a frequency which is one fourth a frequency of the clock signal CLK. In other words, the second division clock signal CLK_4N may have a frequency which is one $(2N)^{th}$ a frequency of the first division clock signal CLK_2N. The first division clock signal CLK_2N may be generated to have a cycle time which is twice a cycle time of the clock signal CLK, and the second division clock signal CLK_4N may be generated to have a cycle time which is four times a cycle time of the clock signal CLK. In some embodiments, the first and second division clock signals CLK_2N and CLK_4N may be generated to have cycle times which are multiples of a cycle time of the clock signal CLK.

The internal command generation circuit 30 may include a selection command generation circuit 31 and a selection/transmission circuit 32.

The selection command generation circuit 31 may delay the input command CMD_L1 by a predetermined period according to a second group LTC<3:N> of a latency information signal LTC<1:N> and an enablement signal EN<1:7> in synchronization with the first and second division clock signals CLK_2N and CLK_4N to generate a plurality of selection commands, for example, first to seventh selection commands SCMD<1:7>. The predetermined period may be set to be a latency having an amount of delay or delay amount which is determined according to the latency information signal LTC<1:N>. The predetermined period may be set as a sum of a first delay amount corresponding to "N" times a cycle time of the second division clock signal CLK_4N and a second delay amount corresponding to "M" times a cycle time of the clock signal CLK. The numbers "N" and "M" may be natural numbers. A method of setting the first and second delay amounts will be described in detail later. The latency information signal LTC<1:N> may be a signal for setting the latency of the semiconductor device. A first group LTC<1:2> of the latency information signal LTC<1:N> may be a signal for setting the second delay amount. The second group LTC<3:N> of the latency information signal LTC<1:N> may be a signal for setting the first delay amount. The latency may be defined as a standby time from a time that the external command EX_CMD is inputted to the semiconductor device until a time that the internal operation corresponding to the external command EX_CMD completely terminates. For example, the latency may be a CAS latency CL corresponding to a time period from a time that the external command EX_CMD for the read operation is inputted to the semiconductor device until a time that data is actually outputted from the semiconductor device.

The selection/transmission circuit 32 may detect a time that the external command EX_CMD is inputted to the semiconductor device and may output any one of the plurality of selection commands SCMD<1:7> as an internal command ICMD according to the detection result. The selection/transmission circuit 32 may compare the first group LTC<1:2> of the latency information signal LTC<1:N> with a phase signal (PH<1:2> of FIG. 8) generated according to an input time of the external command EX_CMD to generate the enablement signal EN<1:7>. The selection/transmission circuit 32 may output any one of the plurality of selection commands SCMD<1:7> as the internal command ICMD in response to the external command EX_CMD.

As described above, the internal command generation circuit 30 may delay the input command CMD_L1 by a predetermined period according to the latency information signal LTC<1:N> to generate the internal command ICMD, in synchronization with the first and second division clock signals CLK_2N and CLK_4N.

The internal circuit 40 may perform one of various internal operations in response to the internal command ICMD. The internal circuit 40 may be realized using a general memory circuit that receives or outputs data in response to the internal command ICMD. The internal circuit 40 may be realized using a volatile memory circuit or a nonvolatile memory circuit according to the embodiment.

Figure 2:
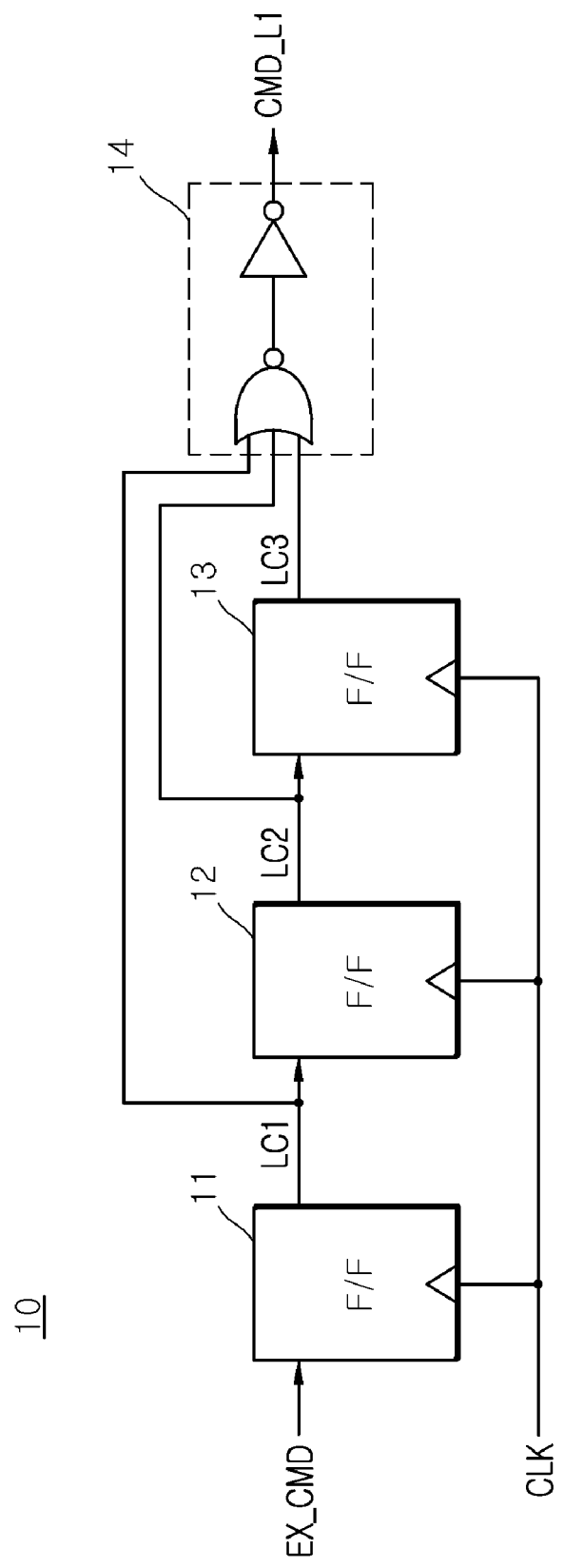
FIG. 2 is a circuit diagram illustrating a configuration of a command input circuit included in the semiconductor device of FIG. 1.

Referring to FIG. 2, the command input circuit 10 may include a first latch command generation circuit 11, a second latch command generation circuit 12, a third latch command generation circuit 13, and an input command generation circuit 14.

The first latch command generation circuit 11 may output the external command EX_CMD as a first latch command LC1 in response to the clock signal CLK. The first latch command generation circuit 11 may be synchronized with a rising edge of the clock signal CLK to latch the external command EX_CMD and to output the latched external command EX_CMD as the first latch command LC1. The first latch command generation circuit 11 may be realized using a general flip-flop F/F.

The second latch command generation circuit 12 may output the first latch command LC1 as a second latch command LC2 in response to the clock signal CLK. The second latch command generation circuit 12 may be synchronized with a rising edge of the clock signal CLK to latch the first latch command LC1 and to output the latched first latch command LC1 as the second latch command LC2. The second latch command generation circuit 12 may be realized using a general flip-flop F/F.

The third latch command generation circuit 13 may output the second latch command LC2 as a third latch command LC3 in response to the clock signal CLK. The third latch command generation circuit 13 may be synchronized with a rising edge of the clock signal CLK to latch the second latch command LC2 and to output the latched second latch command LC2 as the third latch command LC3. The third latch command generation circuit 13 may be realized using a general flip-flop F/F.

The input command generation circuit 14 may generate the input command CMD_L1 which is enabled in response to the first, second, and third latch commands LC1, LC2, and LC3. The input command generation circuit 14 may generate the input command CMD_L1 which is enabled to have a logic "high" level if at least one of the first, second, and third latch commands LC1, LC2, and LC3 is enabled to have a logic "high" level. The input command generation circuit 14 may perform a logical OR operation of the first, second, and third latch commands LC1, LC2, and LC3 to generate the input command CMD_L1.

Figure 3:
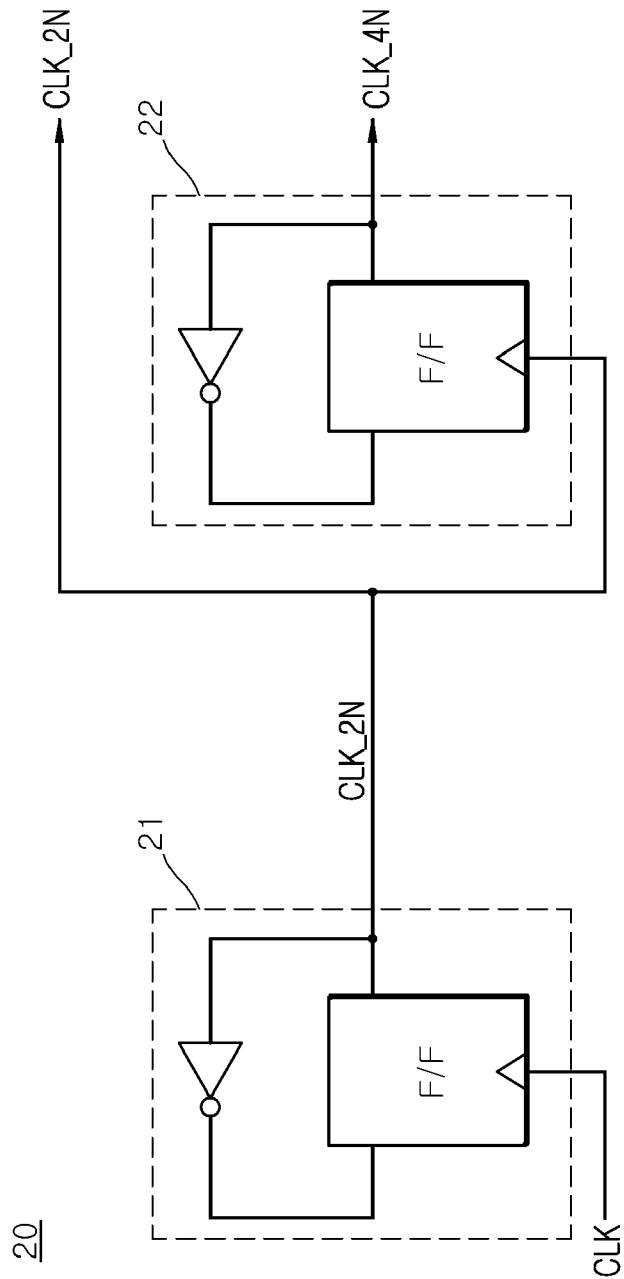
FIG. 3 is a circuit diagram illustrating a configuration of a frequency division circuit included in the semiconductor device of FIG. 1.

Referring to FIG. 3, the frequency division circuit 20 may include a first division clock generation circuit 21 and a second division clock generation circuit 22.

The first division clock generation circuit 21 may divide a frequency of the clock signal CLK to generate the first division clock signal CLK_2N. The first division clock generation circuit 21 may generate the first division clock signal CLK_2N, in accordance with a level transition which occurs in response to a rising edge of the clock signal CLK. The first division clock signal CLK_2N may be generated to have a frequency which is half a frequency of the clock signal CLK.

The second division clock generation circuit 22 may divide a frequency of the first division clock signal CLK_2N to generate the second division clock signal CLK_4N. The second division clock generation circuit 22 may generate the second division clock signal CLK_4N, in accordance with a level transition which occurs in response to a rising edge of the first division clock signal CLK_2N. The second division clock signal CLK_4N may be generated to have a frequency which is one fourth a frequency of the clock signal CLK.

Figure 4:
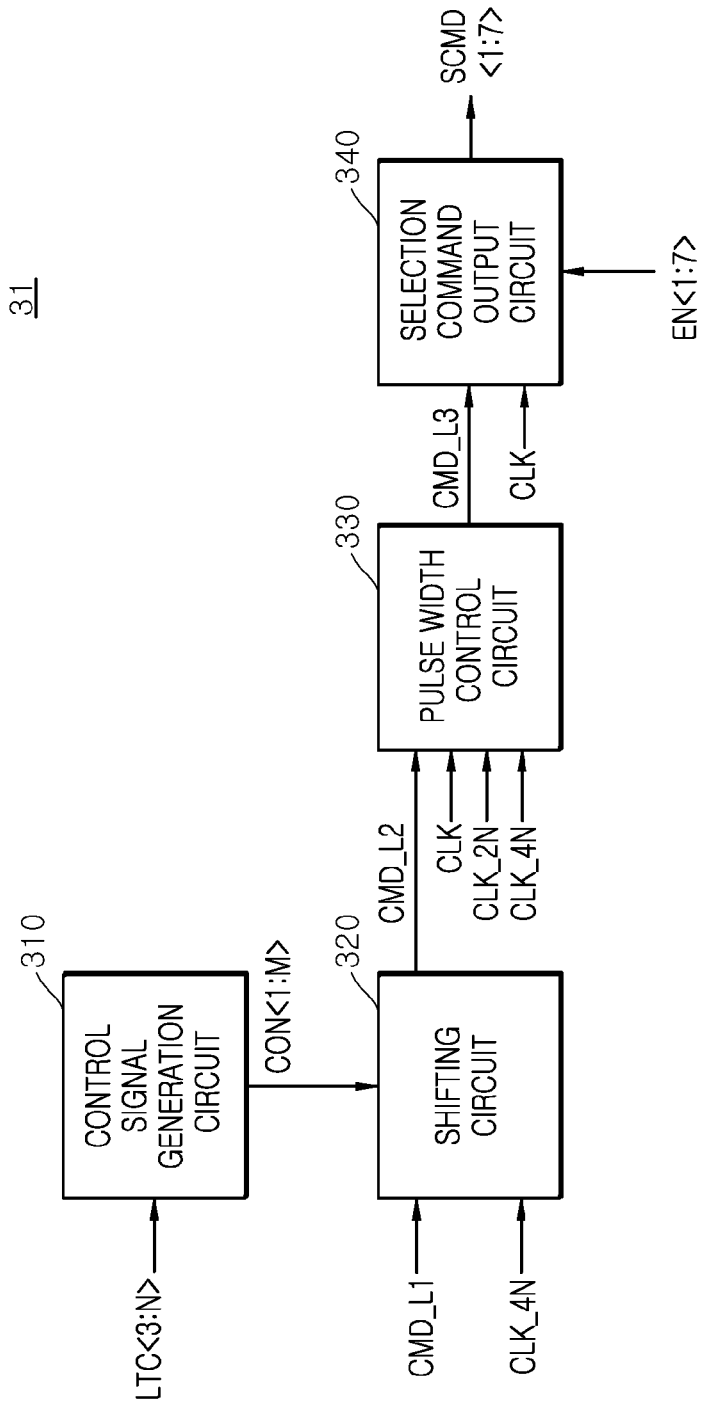
FIG. 4 is a block diagram illustrating a configuration of a selection command generation circuit included in the semiconductor device of FIG. 1.

Referring to FIG. 4, the selection command generation circuit 31 may include a control signal generation circuit 310, a shifting circuit 320, a pulse width control circuit 330, and a selection command output circuit 340.

The control signal generation circuit 310 may decode the second group LTC<3:N> of the latency information signal LTC<1:N> to generate a control signal CON<1:M> including first to $M^{th}$ control signals, one of which is selectively enabled. The control signal CON<1:M> may be a signal for setting the first delay amount.

The shifting circuit 320 may delay the input command CMD_L1 by the first delay amount in synchronization with the second division clock signal CLK_4N to generate a first shift command CMD_L2, in response to the control signal CON<1:M>. The first delay amount may be set to be "N" times a cycle time of the second division clock signal CLK_4N according to the control signal CON<1:M>.

The pulse width control circuit 330 may control a pulse width of the first shift command CMD_L2 in synchronization with the clock signal CLK, the first division clock signal CLK_2N, and the second division clock signal CLK_4N to generate a second shift command CMD_L3. The second shift command CMD_L3 may be generated to have a pulse width which is equal to one cycle time of the clock signal CLK.

The selection command output circuit 340 may be synchronized with the clock signal CLK to output the second shift command CMD_L3 as one of the plurality of selection commands SCMD<1:7>, in response to the enablement signal EN<1:7>.

Figure 5:
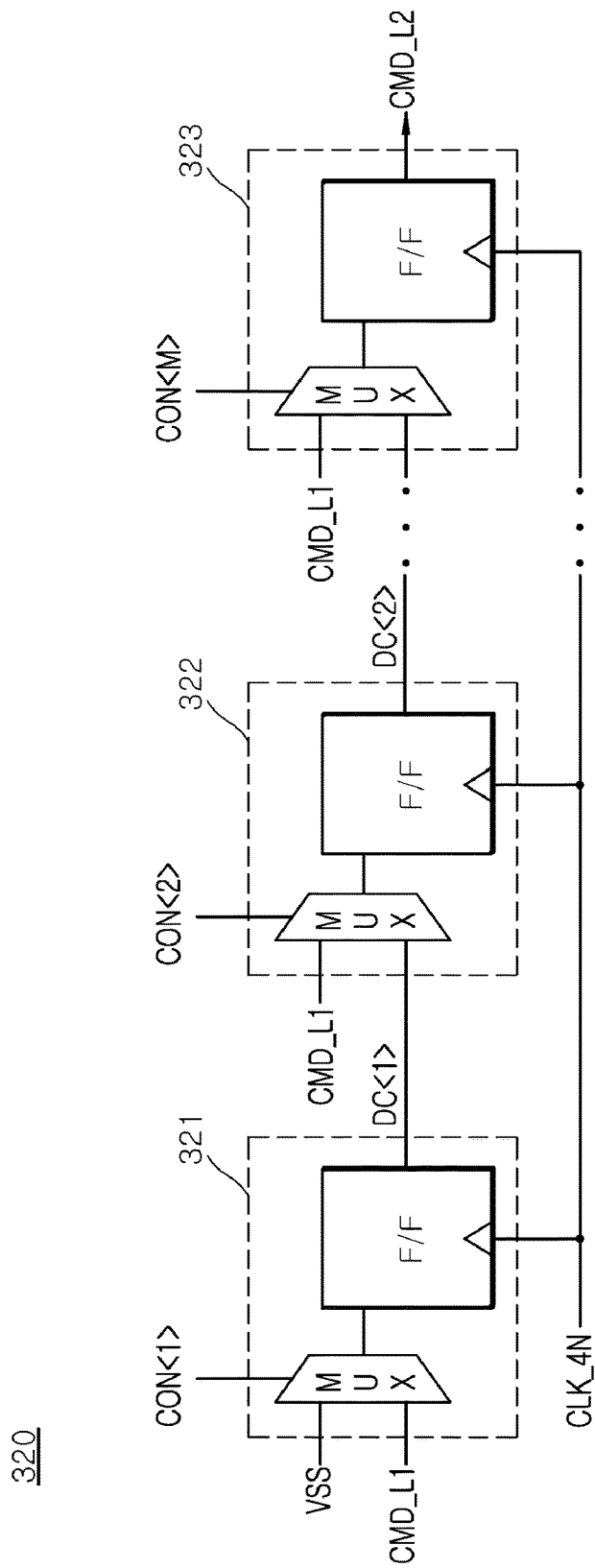
FIG. 5 is a circuit diagram illustrating a configuration of a shifting circuit included in the selection command generation circuit of FIG. 4.

Referring to FIG. 5, the shifting circuit 320 may include a first delay circuit 321, a second delay circuit 322, and an $M^{th}$ delay circuit 323.

The first delay circuit 321 may be synchronized with a rising edge of the second division clock signal CLK_4N in response to the first control signal CON<1> to output a ground voltage VSS or the input command CMD_L1 as a first delayed command DC<1>. The first delay circuit 321 may be synchronized with a rising edge of the second division clock signal CLK_4N to output the ground voltage VSS as the first delayed command DC<1>, if the first control signal CON<1> is disabled to have a logic "low" level. The first delay circuit 321 may be synchronized with a rising edge of the second division clock signal CLK_4N to output the delayed input command CMD_L1 as the first delayed command DC<1>, if the first control signal CON<1> is enabled to have a logic "high" level. The first delay circuit 321 may be designed to have a delay time corresponding to one cycle time of the second division clock signal CLK_4N.

The second delay circuit 322 may be synchronized with a rising edge of the second division clock signal CLK_4N in response to the second control signal CON<2> to output the input command CMD_L1 or the first delayed command DC<1> as a second delayed command DC<2>. The second delay circuit 322 may be synchronized with a rising edge of the second division clock signal CLK_4N to output the delayed first delayed command DC<1> as the second delayed command DC<2>, if the second control signal CON<2> is disabled to have a logic "low" level. The second delay circuit 322 may be synchronized with a rising edge of the second division clock signal CLK_4N to output the delayed input command CMD_L1 as the second delayed command DC<2>, if the second control signal CON<2> is enabled to have a logic "high" level. The second delay circuit 322 may be designed to have a delay time corresponding to one cycle time of the second division clock signal CLK_4N.

The $M^{th}$ delay circuit 323 may be synchronized with a rising edge of the second division clock signal CLK_4N in response to the $M^{th}$ control signal CON<M> to output the input command CMD_L1 or the $(M-1)^{th}$ delayed command DC<M-1> as the first shift command CMD_L2. The $M^{th}$ delay circuit 323 may be synchronized with a rising edge of the second division clock signal CLK_4N to output the delayed $(M-1)^{th}$ delayed command DC<M-1> as the first shift command CMD_L2, if the $M^{th}$ control signal CON<M> is disabled to have a logic "low" level. The $M^{th}$ delay circuit 323 may be synchronized with a rising edge of the second division clock signal CLK_4N to output the delayed input command CMD_L1 as the first shift command CMD_L2, if the $M^{th}$ control signal CON<M> is enabled to have a logic "high" level. The $M^{th}$ delay circuit 323 may be designed to have a delay time corresponding to one cycle time of the second division clock signal CLK_4N.

Each of the third to $(M-1)^{th}$ delay circuits (not shown) may be realized to have substantially the same configuration as the second delay circuit 322 or the $M^{th}$ delay circuit 323 with the exception of the input and output signals. Accordingly, each of the third to $(M-1)^{th}$ delay circuits (not shown) may perform substantially the same operation as the second delay circuit 322 or the $M^{th}$ delay circuit 323. Thus, description of the third to $(M-1)^{th}$ delay circuits (not shown) will be omitted hereinafter. In addition, the number of the delay circuits included in the shifting circuit 320 may be set to be equal to the number of bits of the control signal CON<1:M>, that is, the number of the first to $M^{th}$ control signals CON<1:M>.

An operation for generating the first shift command CMD_L2 by delaying the input command CMD_L1 by the first delay amount which is set according to the control signal CON<1:M> will be described more fully hereinafter.

The shifting circuit 320 may delay the input command CMD_L1 by the first delay amount determined to be "M" times a cycle time of the second division clock signal CLK_4N to generate the first shift command CMD_L2, if the first control signal CON<1> is enabled.

The shifting circuit 320 may delay the input command CMD_L1 by the first delay amount determined to be "(M−1)" times a cycle time of the second division clock signal CLK_4N to generate the first shift command CMD_L2, if the second control signal CON<2> is enabled.

The shifting circuit 320 may delay the input command CMD_L1 by the first delay amount determined to be one cycle time of the second division clock signal CLK_4N to generate the first shift command CMD_L2, if the $M^{th}$ control signal CON<M> is enabled.

Figure 6:
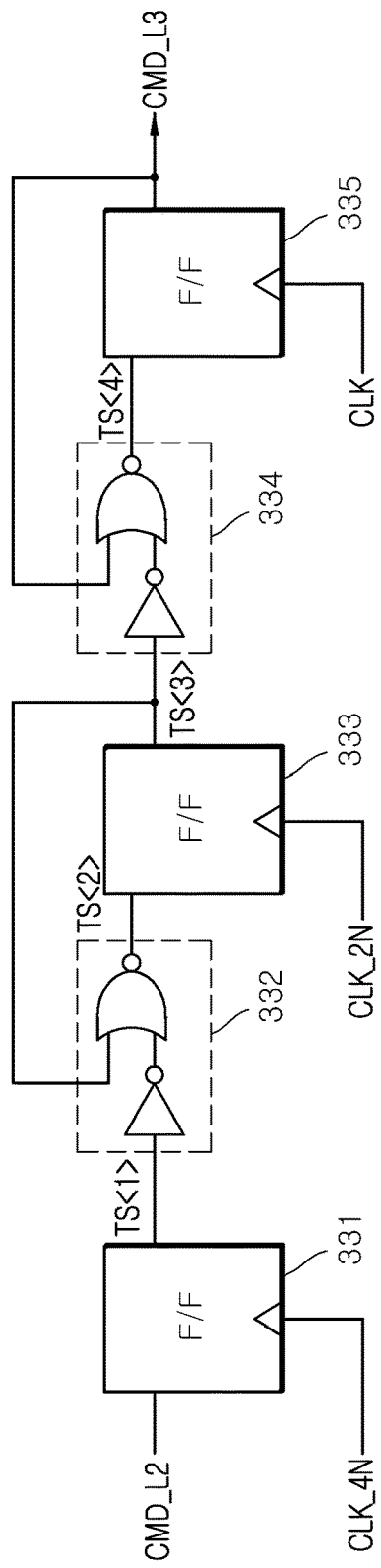
FIG. 6 is a circuit diagram illustrating a configuration of a pulse width control circuit included in the selection command generation circuit of FIG. 4.

Referring to FIG. 6, the pulse width control circuit 330 may include a first signal transmission circuit 331, a second signal transmission circuit 332, a third signal transmission circuit 333, a fourth signal transmission circuit 334, and a fifth signal transmission circuit 335.

The first signal transmission circuit 331 may be synchronized with the second division clock signal CLK_4N to output the first shift command CMD_L2 as a first transmission signal TS<1>. The first signal transmission circuit 331 may be synchronized with a rising edge of the second division clock signal CLK_4N to output the first shift command CMD_L2 as the first transmission signal TS<1>.

The second signal transmission circuit 332 may output a third transmission signal TS<3> as a second transmission signal TS<2> in response to the first transmission signal TS<1>. The second signal transmission circuit 332 may invert the third transmission signal TS<3> to output the inverted third transmission signal TS<3> as the second transmission signal TS<2> if the first transmission signal TS<1> is generated to have a logic "high" level.

The third signal transmission circuit 333 may be synchronized with the first division clock signal CLK_2N to output the second transmission signal TS<2> as the third transmission signal TS<3>. The third signal transmission circuit 333 may be synchronized with a rising edge of the first division clock signal CLK_2N to output the second transmission signal TS<2> as the third transmission signal TS<3>.

The fourth signal transmission circuit 334 may output the second shift command CMD_L3 as a fourth transmission signal TS<4> in response to the third transmission signal TS<3>. The fourth signal transmission circuit 334 may invert the second shift command CMD_L3 to output the inverted second shift command CMD_L3 as the fourth transmission signal TS<4> if the third transmission signal TS<3> is generated to have a logic "high" level.

The fifth signal transmission circuit 335 may be synchronized with the clock signal CLK to output the fourth transmission signal TS<4> as the second shift command CMD_L3. The fifth signal transmission circuit 335 may be synchronized with a rising edge of the clock signal CLK to output the fourth transmission signal TS<4> as the second shift command CMD_L3.

Figure 7:
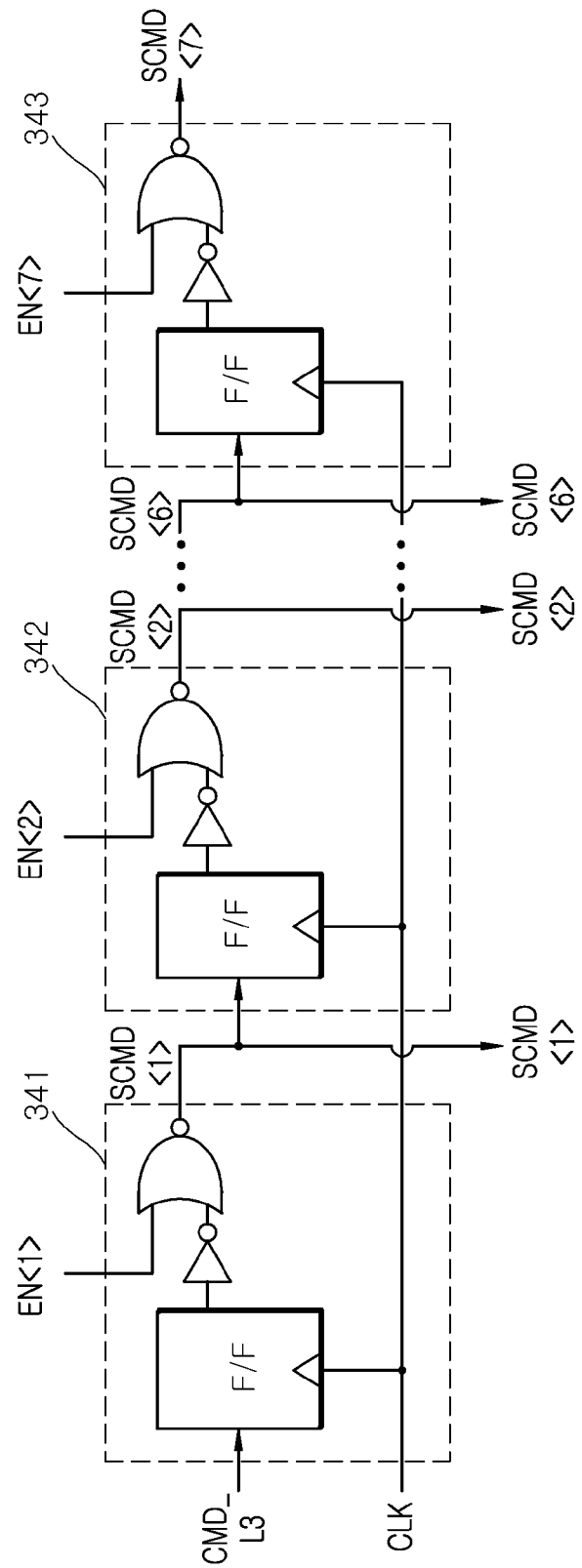
FIG. 7 is a circuit diagram illustrating a configuration of a selection command output circuit included in the selection command generation circuit of FIG. 4.

Referring to FIG. 7, the selection command output circuit 340 may include a first output circuit 341, a second output circuit 342, a third output circuit (not shown), a fourth output circuit (not shown), a fifth output circuit (not shown), a sixth output circuit (not shown), and a seventh output circuit 343.

The first output circuit 341 may be synchronized with the clock signal CLK to output the second shift command CMD_L3 as the first selection command SCMD<1>, in response to the first enablement signal EN<1>. The first output circuit 341 may be synchronized with the clock signal CLK to output the second shift command CMD_L3 as the first selection command SCMD<1>, if the first enablement signal EN<1> has a logic "low" level.

The second output circuit 342 may be synchronized with the clock signal CLK to output the first selection command SCMD<1> as the second selection command SCMD<2>, in response to the second enablement signal EN<2>. The second output circuit 342 may be synchronized with the clock signal CLK to output the first selection command SCMD<1> as the second selection command SCMD<2>, if the second enablement signal EN<2> has a logic "low" level. The second output circuit 342 may output the second selection command SCMD<2> having a logic "low" level if the second enablement signal EN<2> has a logic "high" level.

The third output circuit (not shown) may be synchronized with the clock signal CLK to output the second selection command SCMD<2> as the third selection command SCMD<3>, in response to the third enablement signal EN<3>. The third output circuit may be synchronized with the clock signal CLK to output the second selection command SCMD<2> as the third selection command SCMD<3>, if the third enablement signal EN<3> has a logic "low" level. The third output circuit may output the third selection command SCMD<3> having a logic "low" level if the third enablement signal EN<3> has a logic "high" level.

The fourth output circuit (not shown) may be synchronized with the clock signal CLK to output the third selection command SCMD<3> as the fourth selection command SCMD<4>, in response to the fourth enablement signal EN<4>. The fourth output circuit may be synchronized with the clock signal CLK to output the third selection command SCMD<3> as the fourth selection command SCMD<4>, if the fourth enablement signal EN<4> has a logic "low" level. The fourth output circuit may output the fourth selection command SCMD<4> having a logic "low" level if the fourth enablement signal EN<4> has a logic "high" level.

The fifth output circuit (not shown) may be synchronized with the clock signal CLK to output the fourth selection command SCMD<4> as the fifth selection command SCMD<5>, in response to the fifth enablement signal EN<5>. The fifth output circuit may be synchronized with the clock signal CLK to output the fourth selection command SCMD<4> as the fifth selection command SCMD<5>, if the fifth enablement signal EN<5> has a logic "low" level. The fifth output circuit may output the fifth selection command SCMD<5> having a logic "low" level if the fifth enablement signal EN<5> has a logic "high" level.

The sixth output circuit (not shown) may be synchronized with the clock signal CLK to output the fifth selection command SCMD<5> as the sixth selection command SCMD<6>, in response to the sixth enablement signal EN<6>. The sixth output circuit may be synchronized with the clock signal CLK to output the fifth selection command SCMD<5> as the sixth selection command SCMD<6>, if the sixth enablement signal EN<6> has a logic "low" level. The sixth output circuit may output the sixth selection command SCMD<6> having a logic "low" level if the sixth enablement signal EN<6> has a logic "high" level.

The seventh output circuit 343 may be synchronized with the clock signal CLK to output the sixth selection command SCMD<6> as the seventh selection command SCMD<7>, in response to the seventh enablement signal EN<7>. The seventh output circuit 343 may be synchronized with the clock signal CLK to output the sixth selection command SCMD<6> as the seventh selection command SCMD<7>, if the seventh enablement signal EN<7> has a logic "low" level. The seventh output 343 circuit may output the seventh selection command SCMD<7> having a logic "low" level if the seventh enablement signal EN<7> has a logic "high" level.

The second delay amount may be set to be one cycle time of the clock signal CLK if the first enablement signal EN<1> is enabled and may be set to be twice a cycle time of the clock signal CLK if the first and second enablement signals EN<1:2> are enabled. The second delay amount may be set to be three times a cycle time of the clock signal CLK if the first to third enablement signals EN<1:3> are enabled and may be set to be four times a cycle time of the clock signal CLK if the first to fourth enablement signals EN<1:4> are enabled. The second delay amount may be set to be five times a cycle time of the clock signal CLK if the first to fifth enablement signals EN<1:5> are enabled and may be set to be six times a cycle time of the clock signal CLK if the first to sixth enablement signals EN<1:6> are enabled. The second delay amount may be set to be seven times a cycle time of the clock signal CLK if the first to seventh enablement signals EN<1:7> are enabled.

Figure 8:
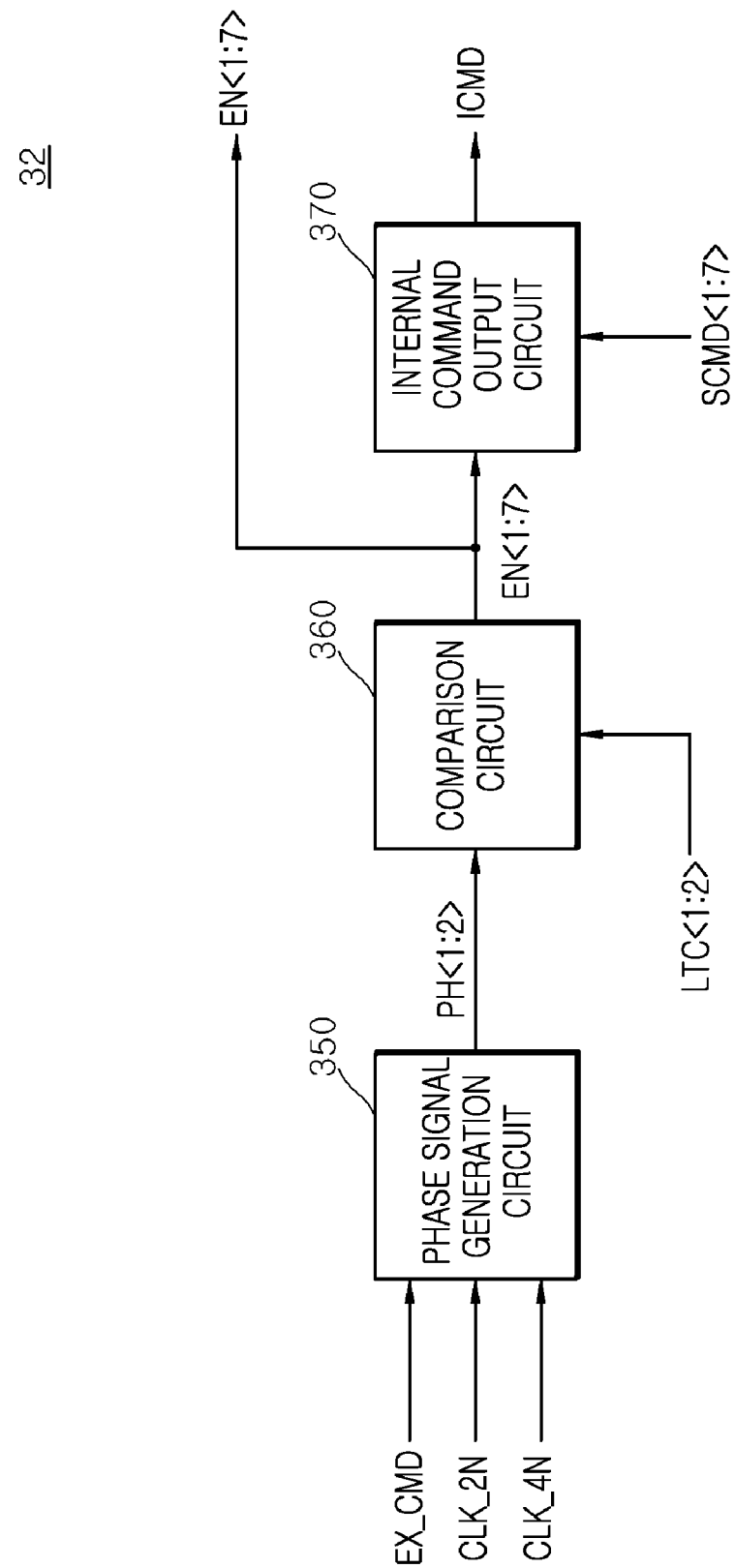
FIG. 8 is a block diagram illustrating a configuration of a selection/transmission circuit included in the semiconductor device of FIG. 1.

Referring to FIG. 8, the selection/transmission circuit 32 may include a phase signal generation circuit 350, a comparison circuit 360, and an internal command output circuit 370.

The phase signal generation circuit 350 may generate the phase signal PH<1:2> according to the first and second division clock signals CLK_2N and CLK_4N in response to the external command EXT_CMD. The phase signal generation circuit 350 may generate the phase signal PH<1:2> according to logic levels of the first and second division clock signals CLK_2N and CLK_4N at a time that the external command EXT_CMD is inputted to the phase signal generation circuit 350. An operation for generating the phase signal PH<1:2> will be described in detail with reference to FIGS. 9 and 10 later.

The comparison circuit 360 may compare the phase signal PH<1:2> with the first group LTC<1:2> of the latency information signal LTC<1:N> to generate the enablement signal EN<1:7>. The comparison circuit 360 may generate a complementary signal of the phase signal PH<1:2> and may add the complementary signal of the phase signal PH<1:2> to the first group LTC<1:2> of the latency information signal LTC<1:N> to generate the enablement signal EN<1:7>. The comparison circuit 360 may subtract the phase signal PH<1:2> from the first group LTC<1:2> of the latency information signal LTC<1:N> to generate the enablement signal EN<1:7> including information on the second delay amount, according to a time that the external command EXT_CMD is inputted.

The internal command output circuit 370 may output any one of the plurality of selection commands SCMD<1:7> as the internal command ICMD in response to the enablement signal EN<1:7>.

An operation of the phase signal generation circuit 350 for generating the phase signal PH<1:2> according to an input time of the external command EXT_CMD will be described hereinafter with reference to FIG. 9.

Figure 9:
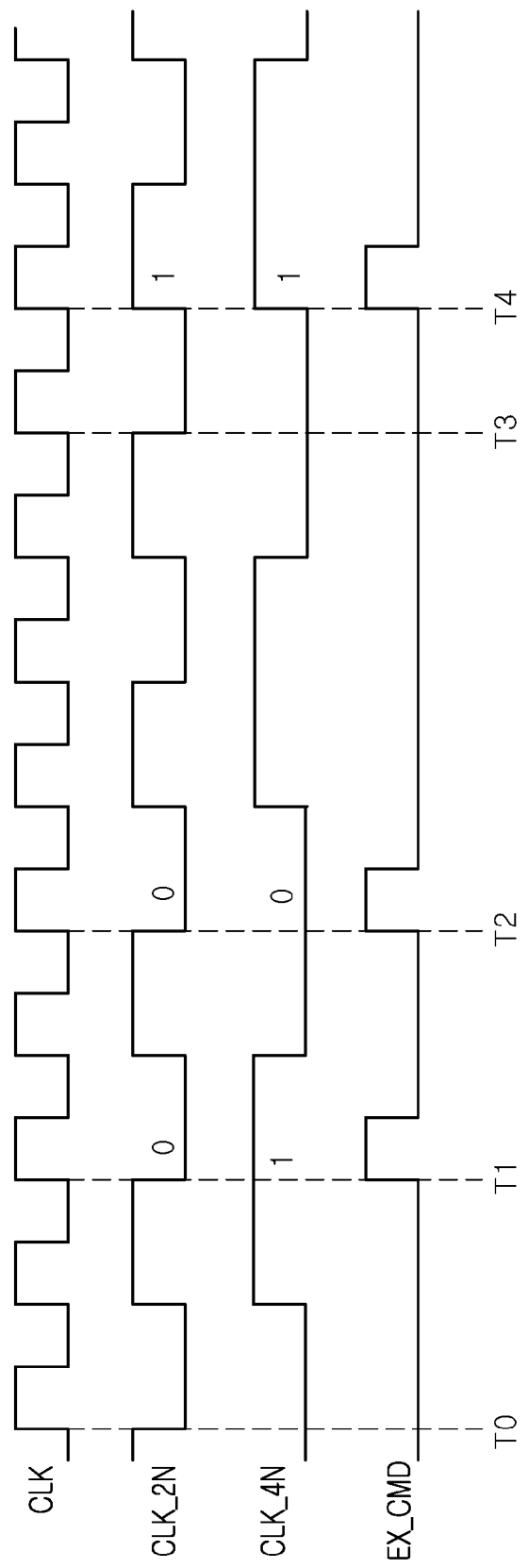
FIG. 9 is a timing diagram illustrating an operation of a phase signal generation circuit included in the selection/transmission circuit of FIG. 8.

In FIG. 9, time "T0" and "T3" may correspond to reference points of time which are compared with the input times of the external command EXT_CMD.

If the external command EXT_CMD is inputted to the phase signal generation circuit 350 at time "T1", the first division clock signal CLK_2N may have a logic "low(0)" level and the second division clock signal CLK_4N may have a logic "high(1)" level. In such a case, the phase signal generation circuit 350 may generate the first phase signal PH<1> having a logic "low(0)" level and the second phase signal PH<2> having a logic "high(1)" level. A case that the first phase signal PH<1> has a logic "low(0)" level and the second phase signal PH<2> has a logic "high(1)" level means that the external command EXT_CMD is inputted at a time that twice a cycle time of the clock signal CLK elapses from the point of time "T0".

If the external command EXT_CMD is inputted to the phase signal generation circuit 350 at time "T2", the first division clock signal CLK_2N may have a logic "low(0)" level and the second division clock signal CLK_4N may have a logic "low(0)" level. In such a case, the phase signal generation circuit 350 may generate the first phase signal PH<1> having a logic "low(0)" level and the second phase signal PH<2> having a logic "low(0)" level. A case that the first phase signal PH<1> has a logic "low(0)" level and the second phase signal PH<2> has a logic "low(0)" level means that the external command EXT_CMD is inputted at a time that four times a cycle time of the clock signal CLK elapses from the time "T0".

If the external command EXT_CMD is inputted to the phase signal generation circuit 350 at time "T4", the first division clock signal CLK_2N may have a logic "high(1)" level and the second division clock signal CLK_4N may have a logic "high(1)" level. In such a case, the phase signal generation circuit 350 may generate the first phase signal PH<1> having a logic "high(1)" level and the second phase signal PH<2> having a logic "low(0)" level. A case that the first phase signal PH<1> has a logic "high(1)" level and the second phase signal PH<2> has a logic "low(0)" level means that the external command EXT_CMD is inputted at a time that one cycle time of the clock signal CLK elapses from the time "T3".

Various logic combinations of the first and second phase signals PH<1:2> generated according to logic levels of the first and second division clock signals CLK_2N and CLK_4N will be described hereinafter with reference to FIG. 10. In addition, various complementary signals of the phase signal PH<1:2> will be described hereinafter with reference to FIG. 10.

Referring to FIG. 10, if the first division clock signal CLK_2N has a logic "low(0)" level and the second division clock signal CLK_4N has a logic "low(0)" level, the first phase signal PH<1> may be generated to have a logic "low(0)" level and the second phase signal PH<2> may be generated to have a logic "low(0)" level. In such a case, a complementary signal of the phase signal PH<1:2> may be set to have a binary number of '000' corresponding to a decimal number of '0'.

If the first division clock signal CLK_2N has a logic "high(1)" level and the second division clock signal CLK_4N has a logic "high(1)" level, the first phase signal PH<1> may be generated to have a logic "high(1)" level and second phase signal PH<2> may be generated to have a logic "low(0)" level. In such a case, a complementary signal of the phase signal PH<1:2> may be set to have a binary number of '111' corresponding to a decimal number of '−1'.

If the first division clock signal CLK_2N has a logic "low(0)" level and the second division clock signal CLK_4N has a logic "high(1)" level, the first phase signal PH<1> may be generated to have a logic "low(0)" level and second phase signal PH<2> may be generated to have a logic "high(1)" level. In such a case, a complementary signal of the phase signal PH<1:2> may be set to have a binary number of '110' corresponding to a decimal number of '−2'.

If the first division clock signal CLK_2N has a logic "high(1)" level and the second division clock signal CLK_4N has a logic "low(0)" level, the first phase signal PH<1> may be generated to have a logic "high(1)" level and second phase signal PH<2> may be generated to have a logic "high(1)" level. In such a case, a complementary signal of the phase signal PH<1:2> may be set to have a binary number of '101' corresponding to a decimal number of '−3'.

Figure 11:
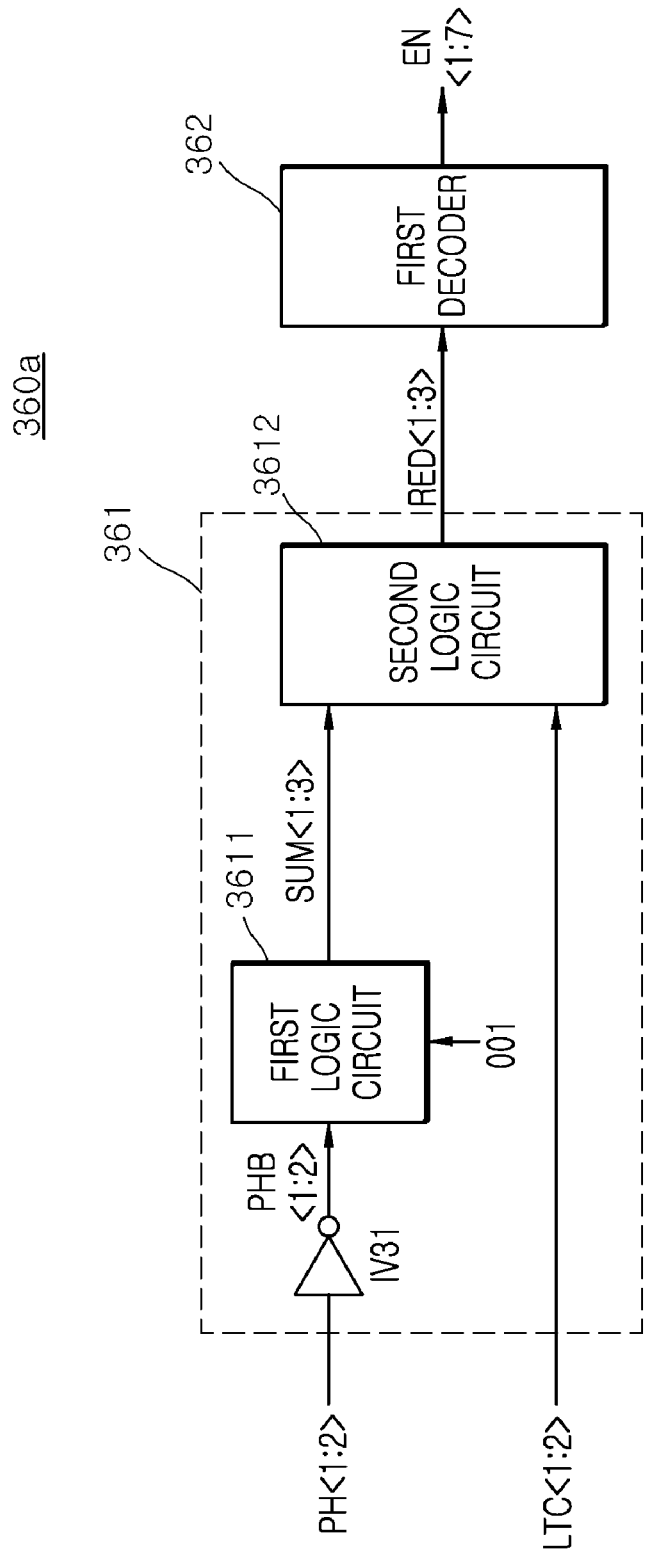
FIG. 11 is a block diagram illustrating a configuration of an example of a comparison circuit included in the selection/transmission circuit of FIG. 8.

Referring to FIG. 11, a comparison circuit 360a corresponding to an example of the comparison circuit 360 shown in FIG. 8 may include a first phase difference signal generation circuit 361 and a first decoder 362.

The first phase difference signal generation circuit 361 may include a buffer IV31, a first logic circuit 3611, and a second logic circuit 3612. The buffer IV31 may inversely buffer the phase signal PH<1:2> to generate an inverted phase signal PHB<1:2> corresponding to a one's complement of the phase signal PH<1:2>. The first logic circuit 3611 may add a binary number of '001' to the inverted phase signal PHB<1:2> to generate a summation signal SUM<1:3> corresponding to a two's complement of the phase signal PH<1:2>. The second logic circuit 3612 may add the summation signal SUM<1:3> to the first group LTC<1:2> of the latency information signal LTC<1:N> to generate a phase difference signal RED<1:3> including first to third phase difference signals RED<1:3>. The first phase difference signal generation circuit 361 may generate a complementary signal of the phase signal PH<1:2> and may add the complementary signal of the phase signal PH<1:2> to the first group LTC<1:2> of the latency information signal LTC<1:N> to generate the phase difference signal RED<1:3>. In other words, the first phase difference signal generation circuit 361 may generate a complementary signal of the latency information signal LTC<1:N> and add the complementary signal of the latency information signal LTC<1:N> to the phase signal PH<1:2> to generate the phase difference signal RED<1:3>.

The first decoder 362 may decode the phase difference signal RED<1:3> to generate the enablement signal EN<1:7>. The first decoder 362 may be realized using a general decoder.

The enablement signal EN<1:7> which may be enabled according to a logic level combination of the phase difference signal RED<1:3> will be described hereinafter with reference to FIG. 12. In addition, the second delay amount, which is set according to the enablement signal EN<1:7>, will be described hereinafter with reference to FIG. 12.

If the third phase difference signal RED<3> has a logic "high(1)" level, the second phase difference signal RED<2> has a logic "low(0)" level, and the first phase difference signal RED<1> has a logic "high(1)" level, the first enablement signal EN<1> may be enabled. A case that the first enablement signal EN<1> of the enablement signal EN<1:7> is enabled means that the second delay amount corresponds to a decimal number of '−3'. That is, a case that the first enablement signal EN<1> of the enablement signal EN<1:7> is enabled means that the external command EXT_CMD is inputted three times a cycle time of the clock signal CLK earlier than a reference time of the clock signal CLK.

If the third phase difference signal RED<3> has a logic "high(1)" level, the second phase difference signal RED<2> has a logic "high(1)" level, and the first phase difference signal RED<1> has a logic "low(0)" level, the first and second enablement signals EN<1:2> may be enabled. This case means that the second delay amount corresponds to a decimal number of '−2'. That is, a case that the first and second enablement signals EN<1:2> of the enablement signal EN<1:7> are enabled means that the external command EXT_CMD is inputted twice a cycle time of the clock signal CLK earlier than a reference time of the clock signal CLK.

If the third phase difference signal RED<3> has a logic "high(1)" level, the second phase difference signal RED<2> has a logic "high(1)" level, and the first phase difference signal RED<1> has a logic "high(1)" level, the first to third enablement signals EN<1:3> may be enabled. This case means that the second delay amount corresponds to a decimal number of '−1'. That is, a case that the first to third enablement signals EN<1:3> of the enablement signal EN<1:7> are enabled means that the external command EXT_CMD is inputted one cycle time of the clock signal CLK earlier than a reference time of the clock signal CLK.

If the third phase difference signal RED<3> has a logic "low(0)" level, the second phase difference signal RED<2> has a logic "low(0)" level, and the first phase difference signal RED<1> has a logic "low(0)" level, the first to fourth enablement signals EN<1:4> may be enabled. This case means that the second delay amount corresponds to a decimal number of '0'. That is, a case that the first to fourth enablement signals EN<1:4> of the enablement signal EN<1:7> are enabled means that the external command EXT_CMD is inputted at a reference time of the clock signal CLK.

If the third phase difference signal RED<3> has a logic "low(0)" level, the second phase difference signal RED<2> has a logic "low(0)" level, and the first phase difference signal RED<1> has a logic "high(1)" level, the first to fifth enablement signals EN<1:5> may be enabled. This case means that the second delay amount corresponds to a decimal number of '+1'. That is, a case that the first to fifth enablement signals EN<1:5> of the enablement signal EN<1:7> are enabled means that the external command EXT_CMD is inputted at a time that one cycle time of the clock signal CLK elapses from a reference time of the clock signal CLK.

If the third phase difference signal RED<3> has a logic "low(0)" level, the second phase difference signal RED<2> has a logic "high(1)" level, and the first phase difference signal RED<1> has a logic "low(0)" level, the first to sixth enablement signals EN<1:6> may be enabled. This case means that the second delay amount corresponds to a decimal number of '+2'. That is, a case that the first to sixth enablement signals EN<1:6> of the enablement signal EN<1:7> are enabled means that the external command EXT_CMD is inputted at a time that twice a cycle time of the clock signal CLK elapses from a reference time of the clock signal CLK.

If the third phase difference signal RED<3> has a logic "low(0)" level, the second phase difference signal RED<2> has a logic "high(1)" level, and the first phase difference signal RED<1> has a logic "high(1)" level, the first to seventh enablement signals EN<1:7> may be enabled. This case means that the second delay amount corresponds to a decimal number of '+3'. That is, a case that all of the first to seventh enablement signals EN<1:7> are enabled means that the external command EXT_CMD is inputted at a time that three times a cycle time of the clock signal CLK elapses from a reference time of the clock signal CLK.

Figure 13:
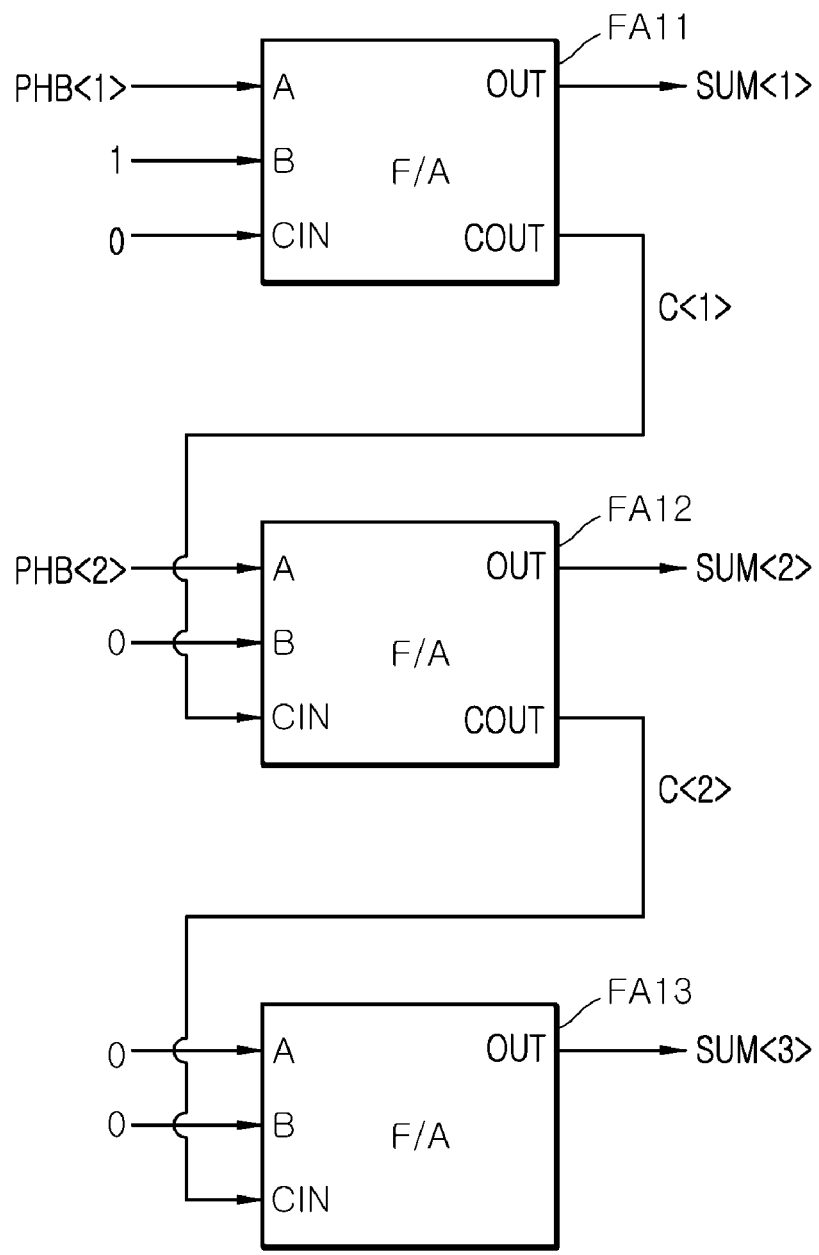
FIG. 13 is a block diagram illustrating a configuration of a first logic circuit included in the comparison circuit of FIG. 11.

Referring to FIG. 13, the first logic circuit 3611 may include a first adder FA11, a second adder FA12, and a third adder FA13.

The first adder FA11 may add the first inverted phase signal PHB<1> to a binary number of '1' to generate the first summation signal SUM<1> and a first carry signal C<1>. The first carry signal C<1> may be a signal including information on whether a carry occurs after the first inverted phase signal PHB<1> is added to a binary number of '1'.

The second adder FA12 may perform a logical OR operation of the second inverted phase signal PHB<2>, a binary number of '0', and the first carry signal C<1> to generate the second summation signal SUM<2> and a second carry signal C<2>. The second carry signal C<2> may be a signal including information on whether a carry occurs after a logical OR operation of the second inverted phase signal PHB<2>, a binary number of '0', and the first carry signal C<1> is performed.

The third adder FA13 may perform a logical OR operation of a binary number of '0', a binary number of '0', and the second carry signal C<2> to generate the third summation signal SUM<3>.

Figure 14:
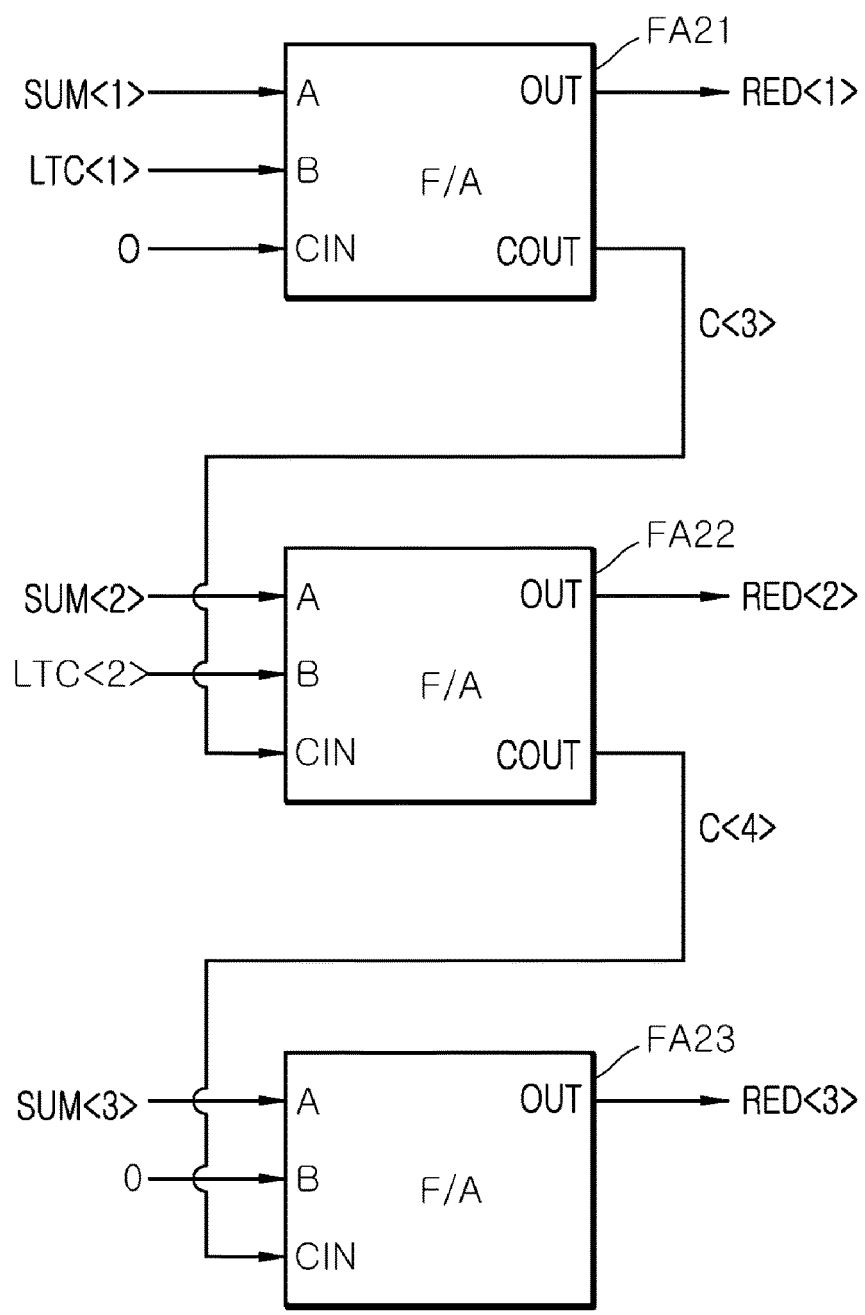
FIG. 14 is a block diagram illustrating a configuration of a second logic circuit included in the comparison circuit of FIG. 11.

Referring to FIG. 14, the second logic circuit 3612 may include a fourth adder FA21, a fifth adder FA22, and a sixth adder FA23.

The fourth adder FA21 may perform a logical OR operation of the first summation signal SUM<1>, the first latency information signal LTC<1>, and a binary number of '0' to generate the first phase difference signal RED<1> and a third carry signal C<3>. The third carry signal C<3> may be a signal including information on whether a carry occurs after a logical OR operation of the first summation signal SUM<1>, the first latency information signal LTC<1>, and a binary number of '0' is performed.

The fifth adder FA22 may perform a logical OR operation of the second summation signal SUM<2>, the second latency information signal LTC<2>, and the third carry signal C<3> to generate the second phase difference signal RED<2> and a fourth carry signal C<4>. The fourth carry signal C<4> may be a signal including information on whether a carry occurs after a logical OR operation of the second summation signal SUM<2>, the second latency information signal LTC<2>, and the third carry signal C<3> is performed.

The sixth adder FA23 may perform a logical OR operation of the third summation signal SUM<3>, a binary number of '0', and the fourth carry signal C<4> to generate the third phase difference signal RED<3>.

Figure 15:
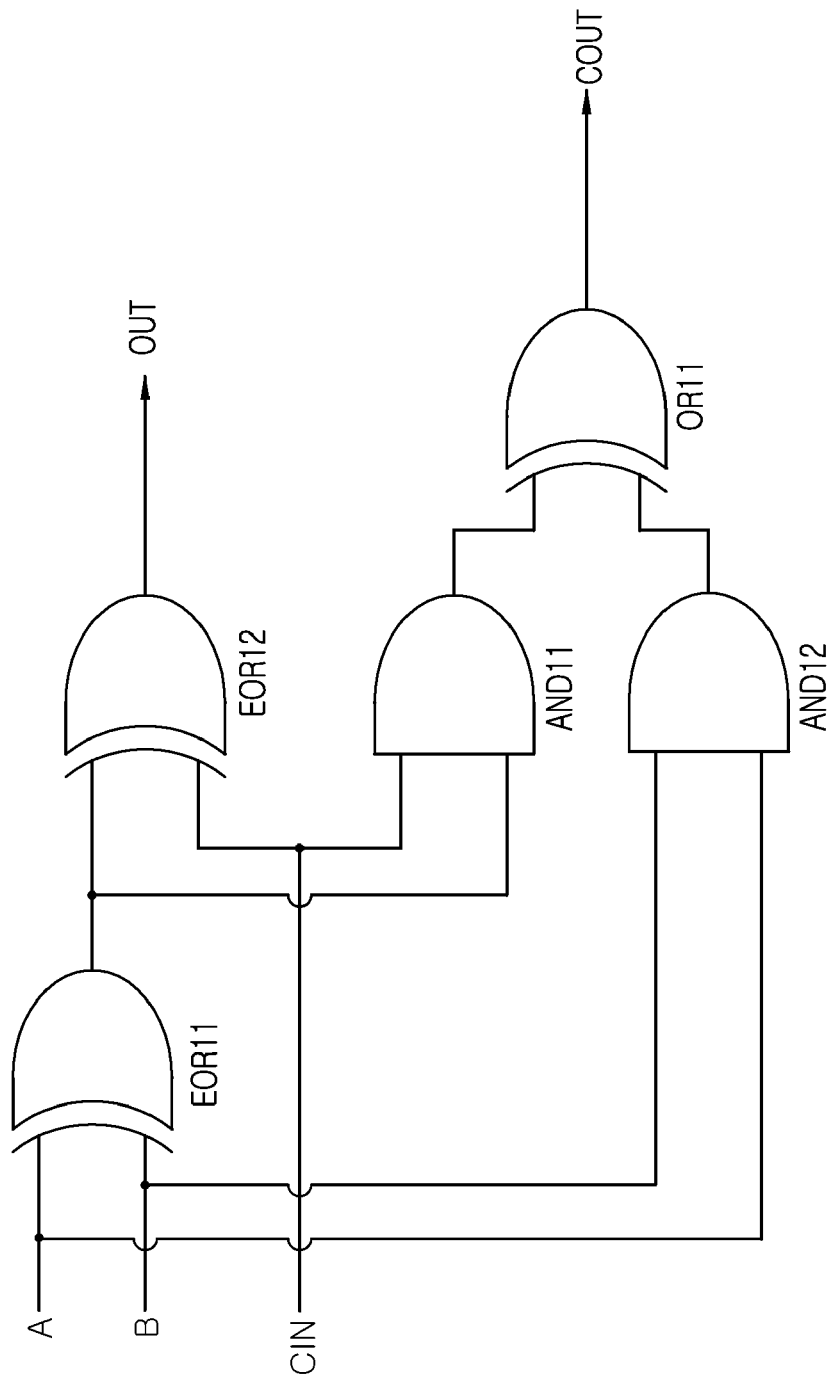
FIG. 15 is a circuit diagram illustrating an example of any one of adders shown in FIGS. 13 and 14.

FIG. 15 is a circuit diagram illustrating any one of the first to sixth adders FA11, FA12, FA13, FA21, FA22, and FA23 shown in FIGS. 13 and 14.

The adder illustrated in FIG. 15 may include exclusive OR gates EOR11 and EOR12, AND gates AND11 and AND12, and an OR gate OR11.

An input terminal A illustrated in FIG. 15 may correspond to any one of the input terminals A illustrated in FIGS. 13 and 14, and an input terminal B illustrated in FIG. 15 may correspond to any one of the input terminals B illustrated in FIGS. 13 and 14. In addition, an input terminal CIN illustrated in FIG. 15 may correspond to any one of the input terminals CIN illustrated in FIGS. 13 and 14, and an output terminal OUT illustrated in FIG. 15 may correspond to any one of the output terminals OUT illustrated in FIGS. 13 and 14. Moreover, an output terminal COUT illustrated in FIG. 15 may correspond to any one of the output terminals COUT illustrated in FIGS. 13 and 14.

The adder illustrated in FIG. 15 may be realized using a general full adder.

Figure 16:
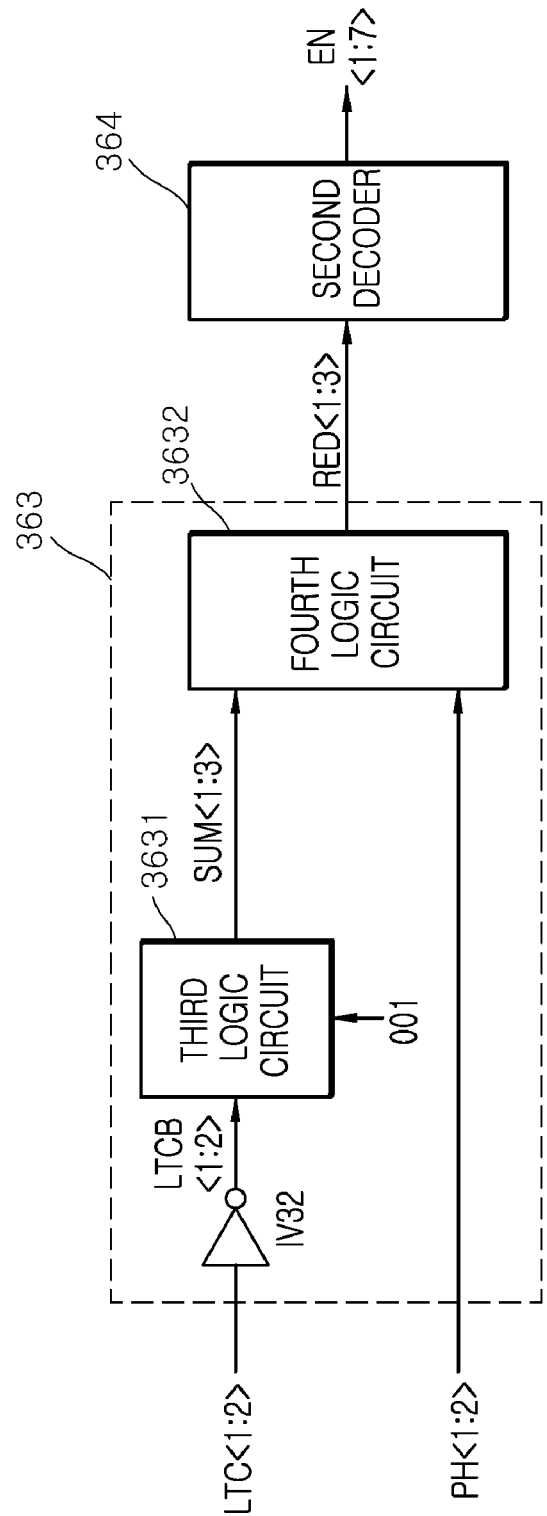
FIG. 16 is a block diagram illustrating a configuration of another example of a comparison circuit included in the selection/transmission circuit of FIG. 8.

Referring to FIG. 16, a comparison circuit 360b corresponding to another example of the comparison circuit 360 shown in FIG. 8 may include a second phase difference signal generation circuit 363 and a second decoder 364.

The second phase difference signal generation circuit 363 may include a buffer IV32, a third logic circuit 3631, and a fourth logic circuit 3632. The buffer IV32 may inversely buffer the first group LTC<1:2> of the latency information signal LTC<1:N> to generate an inverted latency information signal LTCB<1:2> corresponding to a one's complement of the first group LTC<1:2>. The third logic circuit 3631 may add a binary number of '001' to the inverted latency information signal LTCB<1:2> to generate the summation signal SUM<1:3> corresponding to a two's complement of the first group LTC<1:2>. The fourth logic circuit 3632 may add the summation signal SUM<1:3> to the phase signal PH<1:2> to generate the phase difference signal RED<1:3>.

The second decoder 364 may decode the phase difference signal RED<1:3> to generate the enablement signal EN<1:7>. The second decoder 364 may be realized using a general decoder.

The third logic circuit 3631 illustrated in FIG. 16 may be realized to have substantially the same configuration as the first logic circuit 3611 illustrated in FIG. 13 except input and output signals may differ. In addition, the fourth logic circuit 3632 illustrated in FIG. 16 may be realized to have substantially the same configuration as the second logic circuit 3612 illustrated in FIG. 14 except input and output signals may differ. Accordingly, the third logic circuit 3631 may perform substantially the same operation as the first logic circuit 3611, and the fourth logic circuit 3632 may perform substantially the same operation as the second logic circuit 3612. Thus, detailed descriptions of the third and fourth logic circuits 3631 and 3632 will be omitted hereinafter.

An operation of the semiconductor device having the aforementioned configuration will be described hereinafter in conjunction with an example in which a delay time period of the external command determined according to the latency information signal LTC<1:N> is set to be equal to fifteen times a cycle time of the clock signal CLK. In such a case, it is assumed that the external command EX_CMD is inputted twice a cycle time of the clock signal CLK earlier than a reference time of the clock signal CLK.

In the following description, the second group LTC<3:N> of the latency information signal LTC<1:N> may be inputted such that the first delay amount is set to be equal to three times a cycle time of the second division clock signal CLK_4N, and the first group LTC<1:2> of the latency information signal LTC<1:N> may be inputted such that the first delay amount is set to be equal to one cycle time of the clock signal CLK.

The command input circuit 10 may be synchronized with the clock signal CLK to generate the input command CMD_L1 which is enabled during a predetermined period, in response to the external command EX_CMD inputted to the command input circuit 10.

The frequency division circuit 20 may divide a frequency of the clock CLK to generate the first division clock signal CLK_2N and the second division clock signal CLK_4N.

The control signal generation circuit 310 may decode the second group LTC<3:N> of the latency information signal LTC<1:N> to generate the third control signal CON<3> which is enabled among the first to $M^{th}$ control signals CON<1:M>.

The shifting circuit 320 may delay the input command CMD_L1 by the first delay amount corresponding to three times a cycle time of the second division clock signal CLK_4N in synchronization with the second division clock signal CLK_4N to generate the first shift command CMD_L2, in response to the third control signal CON<3>. The first delay amount may be set to be equal to three times a cycle time of the second division clock signal CLK_4N, and three times a cycle time of the second division clock signal CLK_4N may correspond to twelve times a cycle time of the clock signal CLK.

The pulse width control circuit 330 may control a pulse width of the first shift command CMD_L2 in synchronization with the clock signal CLK, the first division clock signal CLK_2N, and the second division clock signal CLK_4N to generate the second shift command CMD_L3. The second shift command CMD_L3 may be generated to have a pulse width which is equal to one cycle time of the clock signal CLK.

The phase signal generation circuit 350 may generate the phase signal PH<1:2> according to logic levels of the first and second division clock signals CLK_2N and CLK_4N in response to the external command EXT_CMD. In such a case, because the external command EXT_CMD is inputted twice a cycle time of the clock signal CLK earlier than a reference time of the clock signal CLK, the first phase signal PH<1> may be generated to have a logic "low(0)" level and the second phase signal PH<2> may be generated to have a logic "high(1)" level.

The first phase difference signal generation circuit 361 of the comparison circuit 360 may generate a complementary signal of the phase signal PH<1:2> and may add the complementary signal of the phase signal PH<1:2> to the first group LTC<1:2> of the latency information signal LTC<1:N> to generate the phase difference signal RED<1:3>. In other words, the first phase difference signal generation circuit 361 may generate a complementary signal of the latency information signal LTC<1:N>, and the first phase difference signal generation circuit 361 may add the complementary signal of the latency information signal LTC<1:N> to the phase signal PH<1:2> to generate the phase difference signal RED<1:3>. In such a case, the first phase difference signal generation circuit 361 may add a binary number of '110' corresponding to the complementary signal of the phase signal PH<1:2> to a binary number of '01' corresponding to the first group LTC<1:2> of the latency information signal LTC<1:N> to generate the third phase difference signal RED<3> having a logic "high(1)" level, the second phase difference signal RED<2> having a logic "high(1)" level, and the first phase difference signal RED<1> having a logic "high(1)" level.

The first decoder 362 of the comparison circuit 360 may decode the first to third phase difference signals RED<1:3> having logic "high(1)" levels to generate the first to third enablement signals EN<1:3> which are enabled to have logic "low(0)" levels.

The selection command output circuit 340 may delay the second shift command CMD_L3 by the second delay amount corresponding to three times a cycle time of the clock signal CLK to output the delayed second shift command CMD_L3 as the third selection command SCMD<3>, in response to the first to third enablement signals EN<1:3>. The second delay amount may be set to be equal to three times a cycle time of the clock signal CLK.

The internal command output circuit 370 may output the third selection command SCMD<3> as the internal command ICMD in response to the first to third enablement signals EN<1:3>. In such a case, the internal command ICMD may be generated when a time period (i.e., fifteen times a cycle time of the clock signal CLK) corresponding to a sum of the first delay amount which is equal to twelve times a cycle time of the clock signal CLK and a second delay amount which is equal to three times a cycle time of the clock signal CLK elapses from an input time of the external command EX_CMD.

The internal circuit 40 may perform an internal operation in response to the internal command ICMD.

As described above, a semiconductor device according to an embodiment may delay an external command by a latency period using division clock signals having cycle times corresponding to "2N" times a cycle time of a clock signal with a plurality of flip-flops to generate an internal command. Thus, if cycle times of the division clock signals increase, the number of flip-flops for delaying the external command may be reduced.

Figure 17:
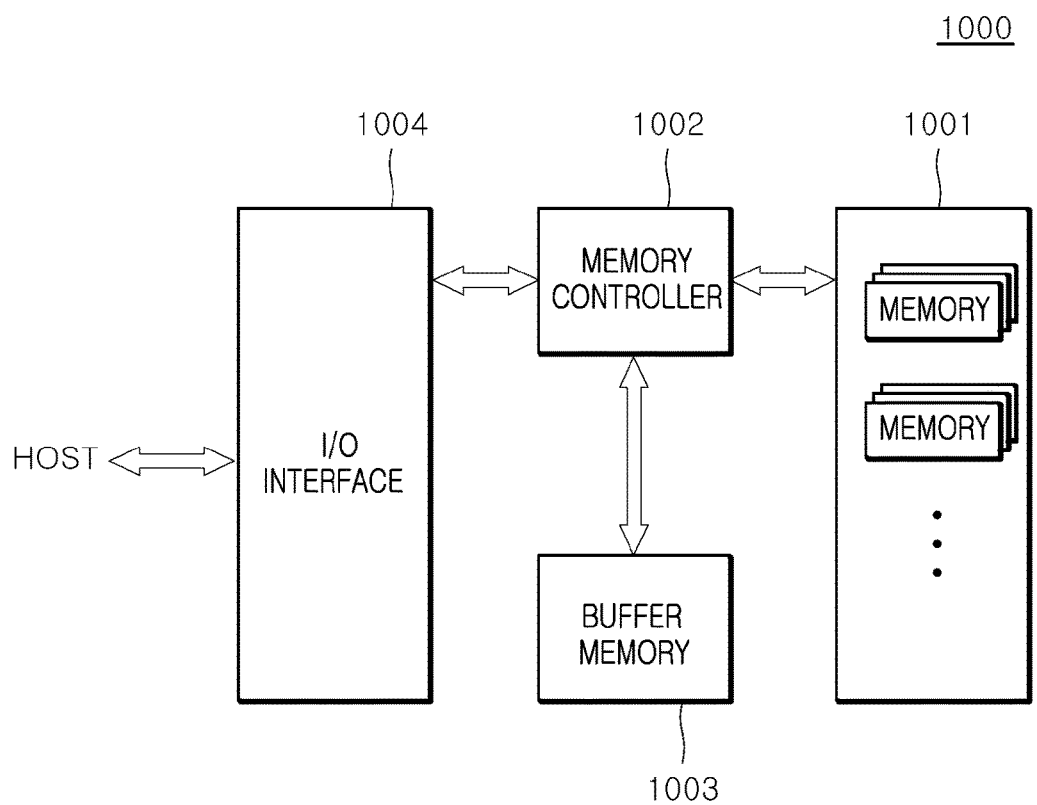
FIG. 17 is a block diagram illustrating a configuration of an electronic system including the semiconductor device illustrated in FIGS. 1 to 16.

The semiconductor device described with reference to FIGS. 1 to 16 may be applied to an electronic system that includes a memory system, a graphic system, a computing system, a mobile system, or the like. For example, as illustrated in FIG. 17, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal outputted from the memory controller 1002. The data storage circuit 1001 may include the semiconductor device illustrated in FIG. 1. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003, or for outputting the data stored in the data storage circuit 1001 or the buffer memory 1003. Although FIG. 17 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data which is processed by the memory controller 1002. That is, the buffer memory 1003 may temporarily store data which is outputted from or inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a command input circuit configured to be synchronized with a clock signal to generate an input command which is enabled if an external command is inputted to the command input circuit; and
an internal command generation circuit configured to delay the input command by a predetermined period according to a latency information signal to generate an internal command, in synchronization with a first division clock signal and a second division clock signal generated by division of a frequency of the clock signal,
wherein the predetermined period is set to be equal to a sum of a first delay amount corresponding to "N" times a cycle time of the second division clock signal and a second delay amount corresponding to "M" times a cycle time of the clock signal.

2. The semiconductor device of claim 1,
wherein the first division clock signal has a frequency which is one $(2N)^{th}$ a frequency of the clock signal; and
wherein the second division clock signal has a frequency which is one $(2N)^{th}$ a frequency of the first division clock signal.

3. The semiconductor device of claim 2, wherein the numbers "N" and "M" are natural numbers.

4. The semiconductor device of claim 1,
wherein the latency information signal includes a first group and a second group;
wherein the first group of the latency information signal is a signal for setting the second delay amount; and
wherein the second group of the latency information signal is a signal for setting the first delay amount.

5. The semiconductor device of claim 1, wherein the internal command generation circuit includes:
a selection command generation circuit configured to delay the input command by the predetermined period according to the latency information signal in synchronization with the first and second division clock signals to generate a plurality of selection commands; and
a selection/transmission circuit configured to detect a time that the external command is inputted and configured to output any one of the plurality of selection commands as the internal command according to the detection result.

6. The semiconductor device of claim 5, wherein the selection command generation circuit includes:
a control signal generation circuit configured to decode the latency information signal to generate a plurality of control signals, one of which is selectively enabled;
a shifting circuit configured to delay the input command by the first delay amount to generate a first shift command, in response to the plurality of control signals;
a pulse width control circuit configured to control a pulse width of the first shift command in synchronization with the clock signal, the first division clock signal, and the second division clock signal to generate a second shift command; and
a selection command output circuit configured to delay the second shift command by the second delay amount to output the delayed second shift command as any one of the plurality of selection commands, in response to an enablement signal generated from the latency information signal.

7. The semiconductor device of claim 6,
wherein the plurality of control signals include a first control signal, a second control signal, and a third control signal; and
wherein the shifting circuit includes:
a first delay circuit configured to delay the input command by one cycle time of the second division clock signal to generate a first delayed command, in response to the first control signal;
a second delay circuit configured to delay the input command or the first delayed command by one cycle time of the second division clock signal to generate a second delayed command, in response to the second control signal; and
a third delay circuit configured to delay the input command or the second delayed command by one cycle time of the second division clock signal to generate the first shift command, in response to the third control signal.

8. The semiconductor device of claim 6,
wherein the enablement signal includes first to fourth enablement signals;
wherein the plurality of selection commands include first to fourth selection commands; and
wherein the selection command output circuit includes:
a first output circuit configured to be synchronized with the clock signal to output the second shift command as the first selection command, in response to the first enablement signal;

a second output circuit configured to be synchronized with the clock signal to output the first selection command as the second selection command, in response to the second enablement signal;
a third output circuit configured to be synchronized with the clock signal to output the second selection command as the third selection command, in response to the third enablement signal; and
a fourth output circuit configured to be synchronized with the clock signal to output the third selection command as the fourth selection command, in response to the fourth enablement signal.

9. The semiconductor device of claim 5, wherein the selection/transmission circuit includes:
a comparison circuit configured to subtract the phase signal, which is generated from the first and second division clock signals, from the latency information signal to generate a plurality of enablement signals, according to a time that the external command is inputted; and
an internal command output circuit configured to output any one of the plurality of selection commands as the internal command in response to the plurality of enablement signals.

10. The semiconductor device of claim 9, wherein the comparison circuit includes:
a phase difference signal generation circuit configured to generate a complementary signal of the phase signal and configured to add the complementary signal of the phase signal to the latency information signal to generate a phase difference signal; and
a decoder configured to decode the phase difference signal to generate the plurality of enablement signals.

11. The semiconductor device of claim 10, wherein the phase difference signal generation circuit includes:
a buffer configured to invert the phase signal to generate an inverted phase signal;
a first logic circuit configured to add a binary number of '1' to the inverted phase signal to generate a summation signal; and
a second logic circuit configured to add the summation signal to the latency information signal to generate the phase difference signal.

12. The semiconductor device of claim 9, wherein the comparison circuit includes:
a phase difference signal generation circuit configured to generate a complementary signal of the latency information signal and configured to add the complementary signal of the latency information signal to the phase signal to generate a phase difference signal; and
a decoder configured to decode the phase difference signal to generate the plurality of enablement signals.

13. The semiconductor device of claim 12, wherein the phase difference signal generation circuit includes:
a buffer configured to invert the latency information signal to generate an inverted latency information signal;
a first logic circuit configured to add a binary number of '1' to the inverted latency information signal to generate a summation signal; and
a second logic circuit configured to add the summation signal to the phase signal to generate the phase difference signal.

14. A semiconductor device comprising:
a selection command generation circuit configured to delay an input command generated from an external command by a predetermined period according to a latency information signal to generate a plurality of selection commands, in synchronization with a first division clock signal and a second division clock signal generated by division of a frequency of a clock signal; and
a selection/transmission circuit configured to detect a time that the external command is inputted and configured to output any one of the plurality of selection commands as an internal command according to the detection result,
wherein the predetermined period is set to be equal to a sum of a first delay amount corresponding to "N" times a cycle time of the second division clock signal and a second delay amount corresponding to "M" times a cycle time of the clock signal.

15. The semiconductor device of claim 14,
wherein the first division clock signal has a frequency which is one $(2N)^{th}$ a frequency of the clock signal; and
wherein the second division clock signal has a frequency which is one $(2N)^{th}$ a frequency of the first division clock signal.

16. The semiconductor device of claim 15, wherein the numbers "N" and "M" are natural numbers.

17. The semiconductor device of claim 14,
wherein the latency information signal includes a first group and a second group;
wherein the first group of the latency information signal is a signal for setting the second delay amount; and
wherein the second group of the latency information signal is a signal for setting the first delay amount.

18. The semiconductor device of claim 14, wherein the selection command generation circuit includes:
a control signal generation circuit configured to decode the latency information signal to generate a plurality of control signals, one of which is selectively enabled;
a shifting circuit configured to delay the input command by the first delay amount to generate a first shift command, in response to the plurality of control signals;
a pulse width control circuit configured to control a pulse width of the first shift command in synchronization with the clock signal, the first division clock signal, and the second division clock signal to generate a second shift command; and
a selection command output circuit configured to delay the second shift command by the second delay amount to output the delayed second shift command as any one of the plurality of selection commands, in response to an enablement signal generated from the latency information signal.

19. The semiconductor device of claim 18,
wherein the plurality of control signals include a first control signal, a second control signal, and a third control signal; and
wherein the shifting circuit includes:
a first delay circuit configured to delay the input command by one cycle time of the second division clock signal to generate a first delayed command, in response to the first control signal;
a second delay circuit configured to delay the input command or the first delayed command by one cycle time of the second division clock signal to generate a second delayed command, in response to the second control signal; and
a third delay circuit configured to delay the input command or the second delayed command by one cycle time of the second division clock signal to generate the first shift command, in response to the third control signal.

20. The semiconductor device of claim 18,
wherein the enablement signal includes first to fourth enablement signals;
wherein the plurality of selection commands include first to fourth selection commands; and
wherein the selection command output circuit includes:
a first output circuit configured to be synchronized with the clock signal to output the second shift command as the first selection command, in response to the first enablement signal;
a second output circuit configured to be synchronized with the clock signal to output the first selection command as the second selection command, in response to the second enablement signal;
a third output circuit configured to be synchronized with the clock signal to output the second selection command as the third selection command, in response to the third enablement signal; and
a fourth output circuit configured to be synchronized with the clock signal to output the third selection command as the fourth selection command, in response to the fourth enablement signal.

21. The semiconductor device of claim 14, wherein the selection/transmission circuit includes:
a comparison circuit configured to subtract the phase signal, which is generated from the first and second division clock signals, from the latency information signal to generate a plurality of enablement signals, according to a time that the external command is inputted; and
an internal command output circuit configured to output any one of the plurality of selection commands as the internal command in response to the plurality of enablement signals.

22. The semiconductor device of claim 21, wherein the comparison circuit includes:
a phase difference signal generation circuit configured to generate a complementary signal of the phase signal and configured to add the complementary signal of the phase signal to the latency information signal to generate a phase difference signal; and
a decoder configured to decode the phase difference signal to generate the plurality of enablement signals.

23. The semiconductor device of claim 22, wherein the phase difference signal generation circuit includes:
a buffer configured to invert the phase signal to generate an inverted phase signal;
a first logic circuit configured to add a binary number of '1' to the inverted phase signal to generate a summation signal; and
a second logic circuit configured to add the summation signal to the latency information signal to generate the phase difference signal.

24. The semiconductor device of claim 21, wherein the comparison circuit includes:
a phase difference signal generation circuit configured to generate a complementary signal of the latency information signal and configured to add the complementary signal of the latency information signal to the phase signal to generate a phase difference signal; and
a decoder configured to decode the phase difference signal to generate the plurality of enablement signals.

25. The semiconductor device of claim 24, wherein the phase difference signal generation circuit includes:
a buffer configured to invert the latency information signal to generate an inverted latency information signal;
a first logic circuit configured to add a binary number of '1' to the inverted latency information signal to generate a summation signal; and
a second logic circuit configured to add the summation signal to the phase signal to generate the phase difference signal.

* * * * *